(12) United States Patent
Liao

(10) Patent No.: US 7,777,650 B2
(45) Date of Patent: Aug. 17, 2010

(54) KEY SYSTEM WITH TWO OPERATION NODES FOR DETECTING STATUS OF KEYS

(75) Inventor: Chien-Chuan Liao, Taipei County (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 882 days.

(21) Appl. No.: 11/624,655

(22) Filed: Jan. 18, 2007

(65) Prior Publication Data

US 2008/0079610 A1  Apr. 3, 2008

(30) Foreign Application Priority Data

Sep. 15, 2006  (TW) ............................... 95134307 A

(51) Int. Cl.
*H03M 11/00* (2006.01)
(52) U.S. Cl. .............................. 341/22; 341/20; 341/26; 340/14.1; 340/2.2; 340/2.27; 340/2.28; 400/472; 400/473; 345/168; 345/156; 178/18.05
(58) Field of Classification Search ................... 341/22, 341/20, 26; 340/14.1, 2.2, 2.27, 2.28; 400/472, 400/473; 345/168, 156; 178/18.05
See application file for complete search history.

(56) References Cited

U.S. PATENT DOCUMENTS

| | | | | |
|---|---|---|---|---|
| 3,715,444 A * | 2/1973 | Pearlman | ...................... | 84/684 |
| 4,498,143 A * | 2/1985 | Strzelecki | ................... | 715/263 |
| 4,518,951 A * | 5/1985 | Backes | ........................ | 341/26 |
| 4,583,189 A * | 4/1986 | Koyama | ..................... | 708/142 |
| 4,585,908 A * | 4/1986 | Smith | ....................... | 379/93.18 |
| 4,633,228 A * | 12/1986 | Larson | ......................... | 341/26 |
| 4,673,933 A * | 6/1987 | Bauer | ......................... | 341/22 |
| 5,184,120 A * | 2/1993 | Schultz | ................. | 340/870.38 |
| 5,371,498 A * | 12/1994 | Kwon et al. | .................. | 341/24 |
| 5,521,575 A * | 5/1996 | Pack | ........................... | 341/26 |
| 5,621,402 A | 4/1997 | Spak | | |
| 5,719,597 A * | 2/1998 | Fong | ......................... | 345/174 |
| 5,831,556 A * | 11/1998 | Niot | ............................ | 341/26 |
| 5,900,829 A * | 5/1999 | Gardner et al. | ................ | 341/26 |
| 5,929,790 A * | 7/1999 | Lim | ............................ | 341/22 |
| 6,020,833 A | 2/2000 | Chang | | |
| 6,178,388 B1 * | 1/2001 | Claxton | ....................... | 702/107 |
| 6,222,466 B1 * | 4/2001 | Uggmark | ...................... | 341/22 |
| 6,577,250 B1 * | 6/2003 | Yee | ............................... | 341/26 |
| 7,095,339 B2 | 8/2006 | Peng et al. | | |
| 2003/0058845 A1 * | 3/2003 | Tierling | ....................... | 370/357 |

FOREIGN PATENT DOCUMENTS

| | | |
|---|---|---|
| JP | 2000-293302 | 10/2000 |
| TW | 569125 | 1/2004 |
| TW | I245212 | 12/2005 |

* cited by examiner

*Primary Examiner*—Timothy Edwards, Jr.
*Assistant Examiner*—Amine Benlagsir
(74) *Attorney, Agent, or Firm*—Winston Hsu

(57) ABSTRACT

A key system utilizes two operation nodes to detect the status of a plurality of keys, and each operation node can output and read a high, a low, and a clock signal. When an operation node outputs a high signal and reads a return signal and then outputs a low signal and reads a return signal, the other operation node outputs a clock signal. Therefore, the two operation nodes can detect the status of six keys.

8 Claims, 5 Drawing Sheets

|  | First operation node | Second operation node |
|---|---|---|
| First key | H→H , L→H | CLK |
| Second key | H→L , L→L | |
| Third key | H→CLK , L→CLK | |
| Fourth key | CLK | H→H , L→H |
| Fifth key | | H→L , L→L |
| Sixth key | | H→CLK , L→CLK |

Fig. 5

KEY SYSTEM WITH TWO OPERATION NODES FOR DETECTING STATUS OF KEYS

BACKGROUND OF THE INVENTION

1. Field of the Invention

The present invention relates to a key system, and more particularly, to a key system utilizing two operation nodes to detect a status of a plurality of keys.

2. Description of the Prior Art

Monitors generally provide keys for users to adjust brightness, contrast, and color of the monitors. The keys are controlled by a microcontroller. In the prior art, the keys can be divided into an analog key system and a digital key system. The analog key system utilizes one I/O pin of the microcontroller to control multiple keys and determines which key is activated by a voltage divider. The digital key system controls one key with one I/O pin of the microcontroller directly.

Please refer to FIG. 1. FIG. 1 is a diagram of an analog key system 10 according to the prior art. The analog key system 10 includes six resistors 11-16 connected in series, and six keys 21-26. One end of the six resistors 11-16 connected in series is connected to a power supply VCC, and another end of the six resistors 11-16 is connected to a ground GND. One end of the six keys 21-26 connects to one end of the six resistors 11-16 respectively, and the other ends of the six keys 21-26 all connect to one I/O pin of a microcontroller 20. The I/O pin of the microcontroller 20 can read the divided voltage of the six resistors 11-16 connected in series to determine which one of the six keys 21-26 is activated.

Please refer to FIG. 2. FIG. 2 is a diagram of a digital key system 30 according to the prior art. The digital key system 30 includes six keys 31-36 and a resistor 37. One end of the resistor 37 is connected to a power supply VCC, and another end of the resistor 37 is connected to a ground GND. One end of the six keys 31-36 connects to the ground GND, and another end of the six keys 31-36 connects to six I/O pins of a microcontroller 38 respectively. Thus, when one of the six key 31-36 is activated, the microcontroller 38 can read the ground voltage from the I/O pins correspondingly.

Keys will oxidize after a period of time, which results in contact fault. The analog key system, which determines which key is activated through voltage division requires high sensitivity; otherwise, it is easy to misjudge which key is activated. The digital key system uses one I/O pin of the microcontroller for each key, which does not make efficient use of the microcontroller pins.

SUMMARY OF THE INVENTION

The present invention provides a key system utilizing two operation nodes to detect a status of a plurality of keys comprising a first key coupled between a first operation node and a high potential end; a second key coupled between the first operation node and a ground; and a third key coupled between the first operation node and a second operation node; wherein the key system can send and read digital signals by the first operation node and the second operation node to detect the status of the keys.

The present invention provides a method for detecting statuses of a plurality of keys with two operation nodes comprising (a) a first operation node outputting a high level signal, a second operation node outputting a clock signal, then the first operation node reading a first returned signal; and (b) the first operation node outputting a low level signal, the second operation node outputting the clock signal, then the first operation node reading a second returned signal; wherein when the first returned signal and the second returned signal are high level signal, define as a first key actuating; when the first returned signal and the second returned signal are low level signal, define as a second key actuating; and when the first returned signal or the second returned signal is the clock signal, define as a third key actuating.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 5 is a table corresponding to the key system in FIG. 3.

DETAILED DESCRIPTION

Figure 1:
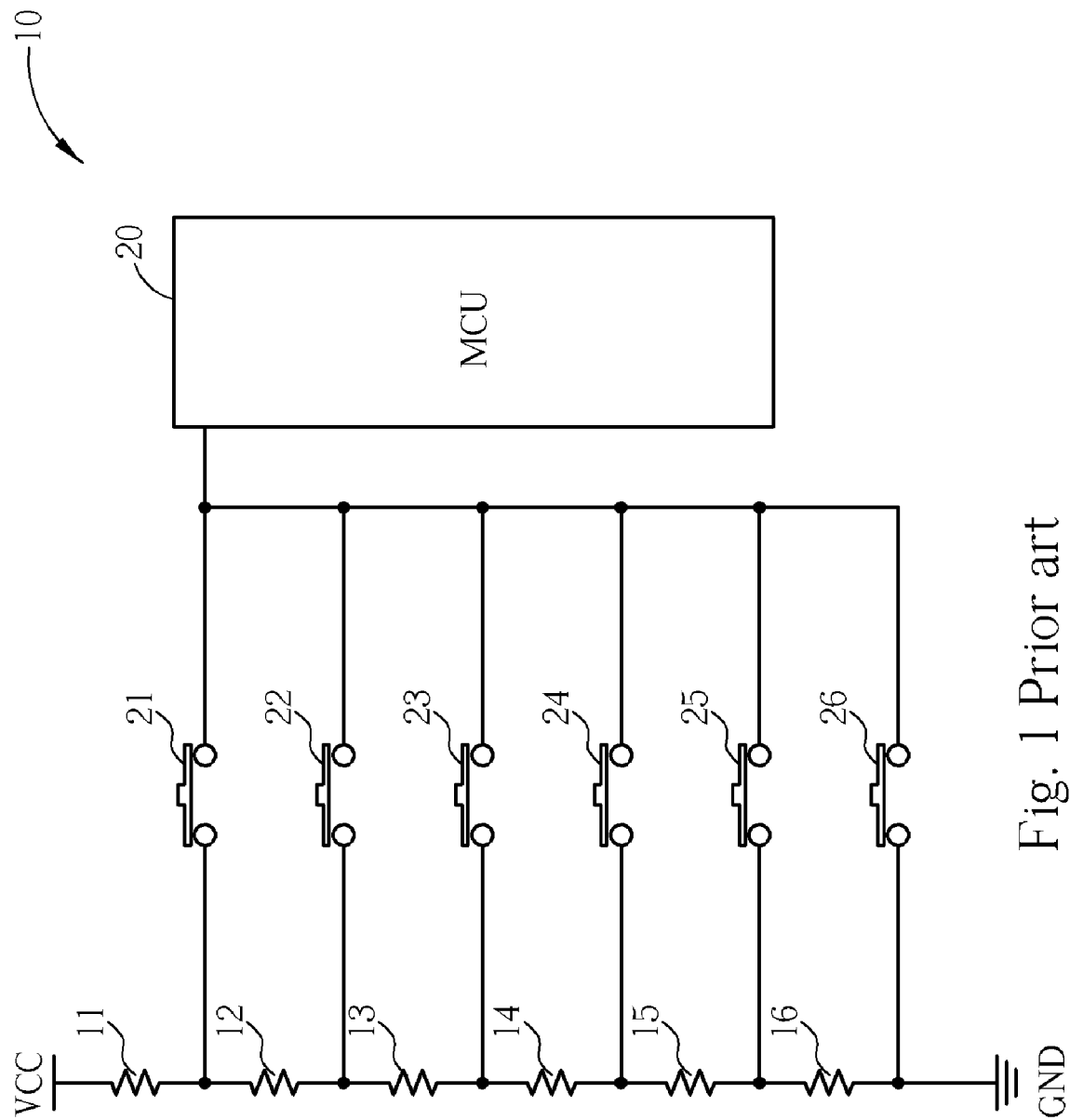
FIG. 1 is a diagram of an analog key system according to the prior art.
Figure 2:
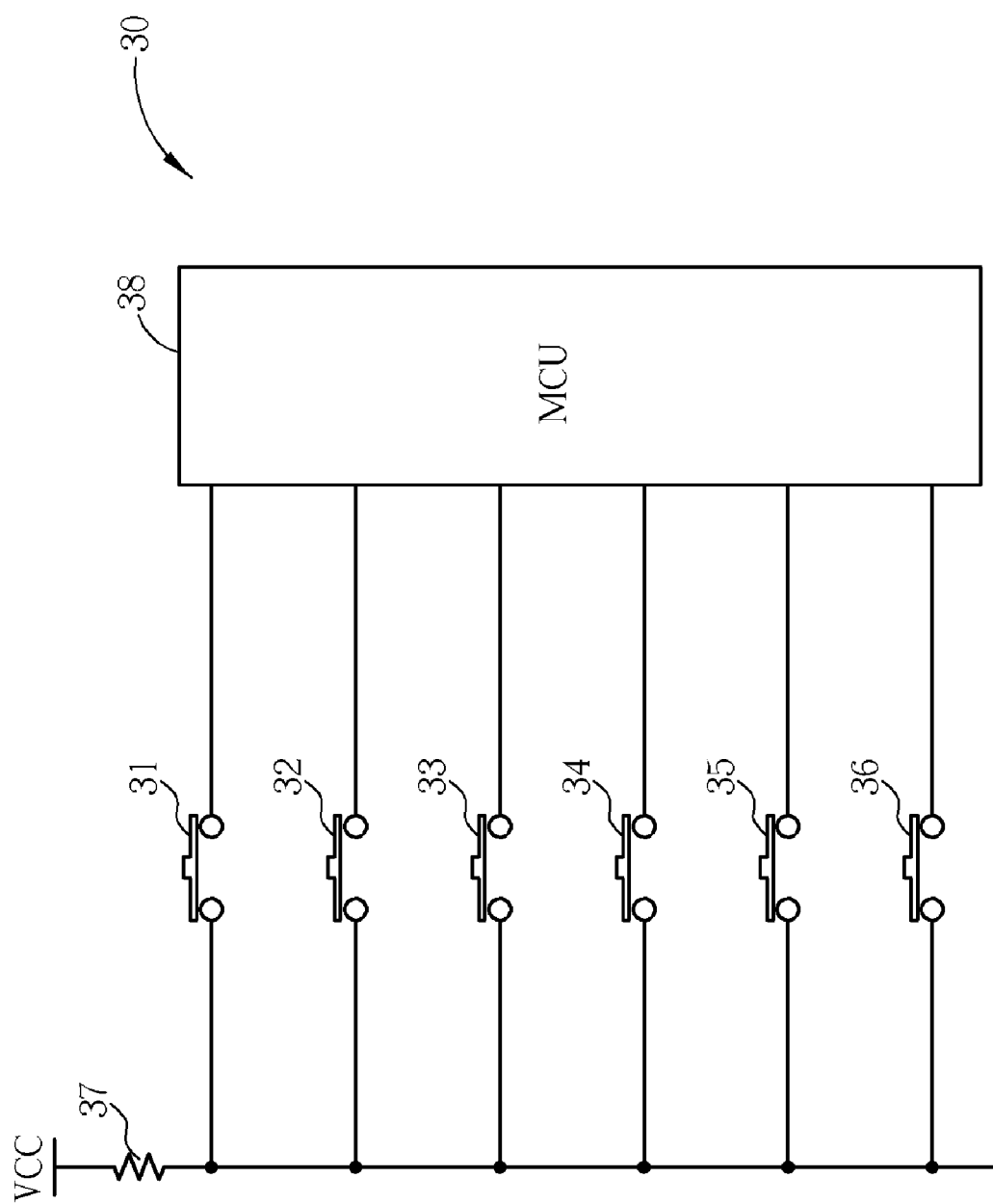
FIG. 2 is a diagram of a digital key system according to the prior art.
Figure 3:
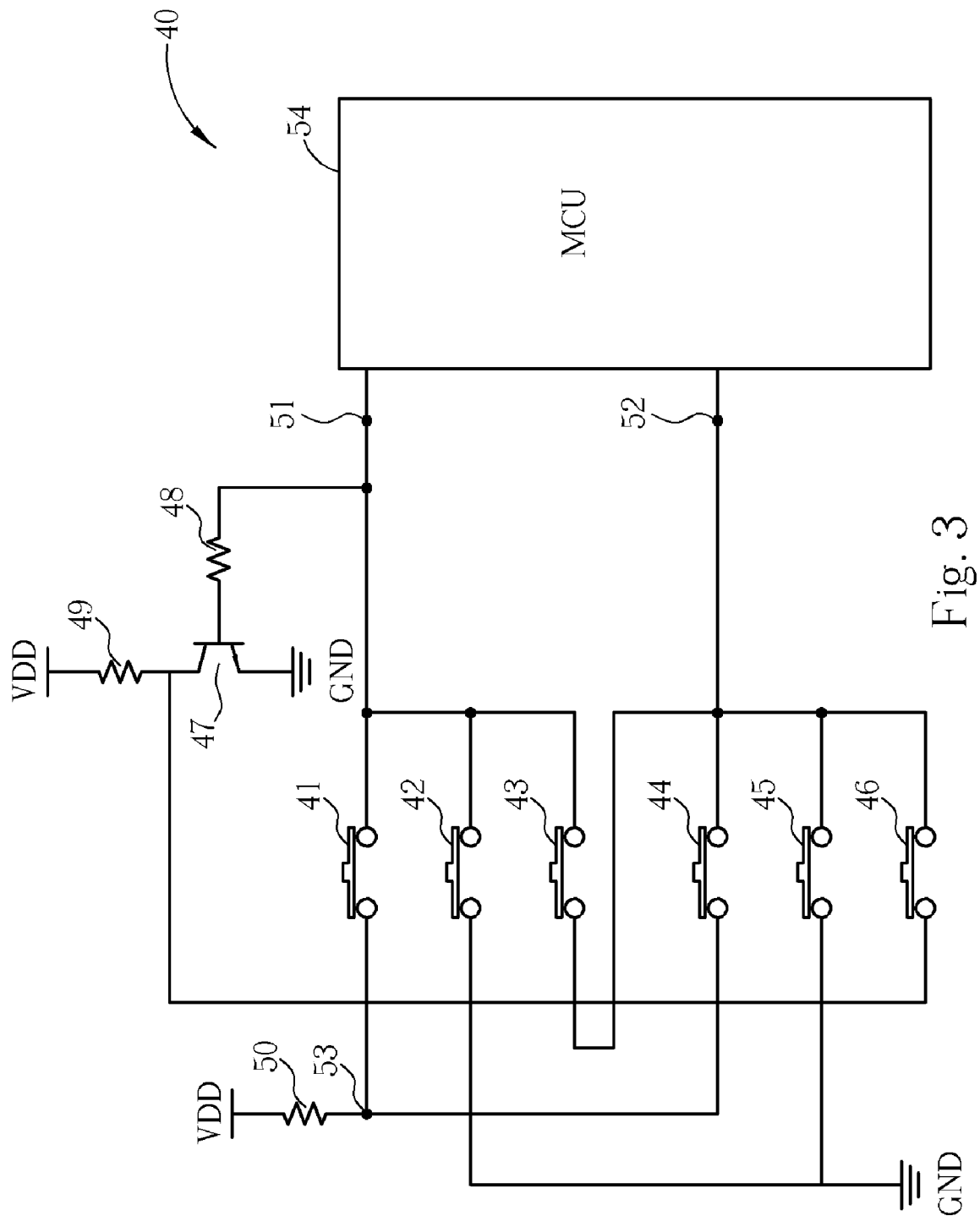
FIG. 3 is a diagram of a key system according to the present invention.

Please refer to FIG. 3. FIG. 3 is a diagram of a key system 40 according to the present invention. The key system 40 comprises a first key 41, a second key 42, a third key 43, a fourth key 44, a fifth key 45, a sixth key 46, a transistor 47, a first resistor 48, a second resistor 49, and a third resistor 50. A first operation node 51 and a second operation node 52 can be used to determine which one of the first key 41 through the sixth key 46 is activated. The two operation node 51, 52 are two I/O pins of a microcontroller 54. The first key 41 is coupled between the first operation node 51 and a high potential end 53. The second key 42 is coupled between the first operation node 51 and a ground GND. The third key 43 is coupled between the first operation node 51 and the second operation node 52. The third resistor 50 is coupled between the high potential end 53 and a power supply VDD. With the circuit mentioned above, the two operation nodes 51, 52 can control the three keys 41-43. In the exemplary embodiment, the transistor 47 is a bipolar junction transistor (BJT), the base of the BJT being the control end, the collector of the BJT being the output end, and the emitter of the BJT being the transistor ground. The control end of the transistor 47 is coupled to the first operation node 51 via the first resistor 48. The output end of the transistor 47 is coupled to the power supply VDD via the second resistor 49. The emitter of the transistor 47 is coupled to the ground GND. The fourth key 44 is coupled between the second operation node 52 and the high potential end 53. The fifth key 45 is coupled between the second operation node 52 and the ground GND. The sixth key 46 is coupled between the second operation node 52 and the output end of the transistor 47. With the circuit mentioned above, the two operation nodes 51, 52 can control the six keys 41-46.

Figure 4:
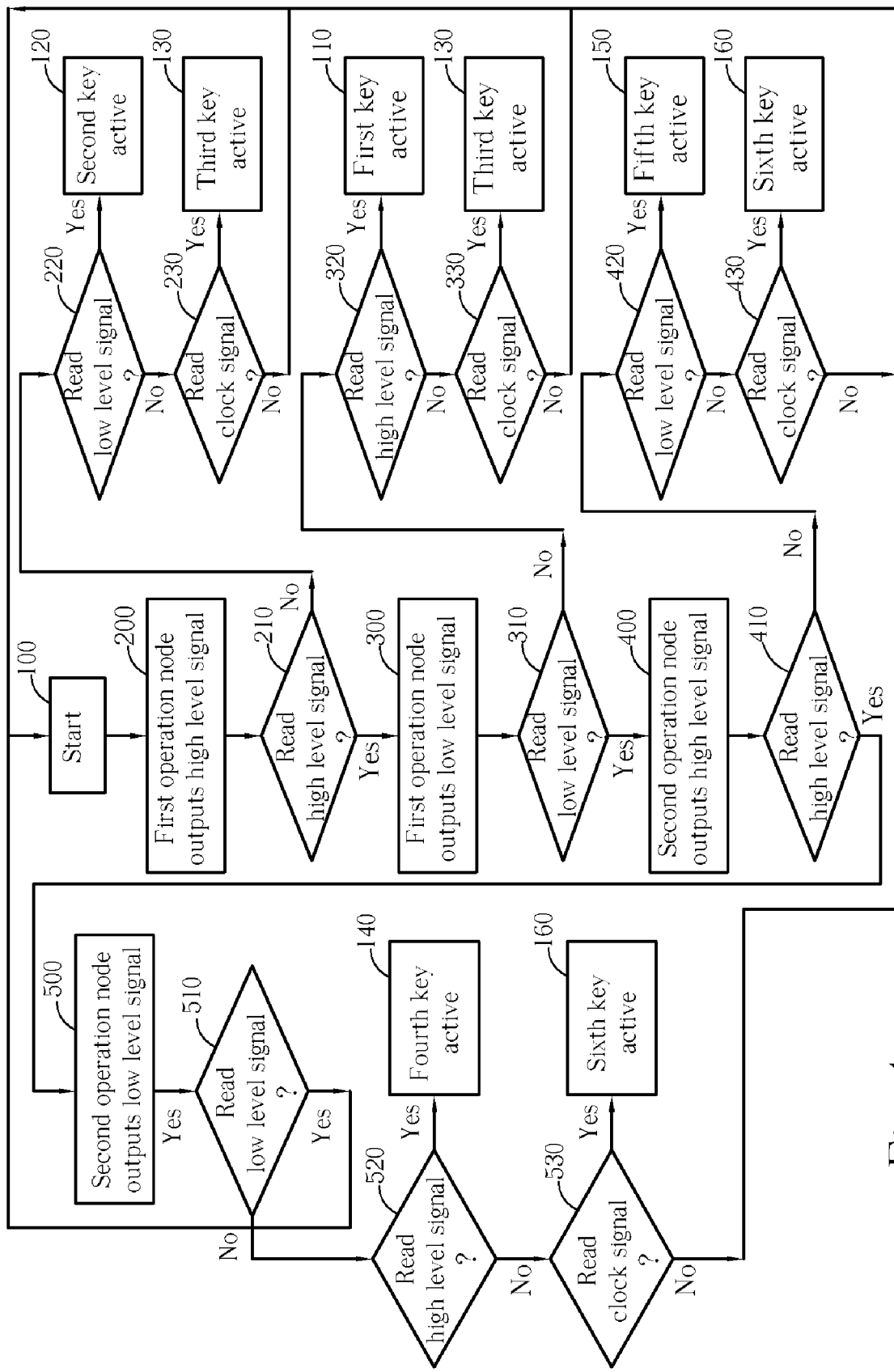
FIG. 4 is a flowchart of the key system in FIG. 3

The I/O pins of the microcontroller 54 can output and read a high level signal, a low level signal, and a clock signal, so the two I/O pins can control the six keys. When the key system is in operation, the first operation node 51 outputs the high level signal and reads the returned signal, and then outputs the low level signal and reads the returned signal; in the meanwhile, the second operation node outputs 52 the clock signal. In the next step, the second operation node 52 outputs the high level signal and reads the returned signal, and then outputs the low level signal and reads the returned signal; in the meanwhile, the first operation node 51 outputs the clock signal. Please refer to FIG. 4 for illustration of detailed operations. FIG. 4 is a flowchart of the key system 40 in FIG. 3. Steps 100, 110, 120, 130, 140, 150, 160 represent states of the first key 41 to the sixth key 46 being activated respectively. Step 200 represents the first operation node 51 outputting the high level signal, and Step 300 represents the first operation node 51 outputting the low level signal; in the meanwhile, the second operation node 52 outputs the clock signal. Steps 210, 220, and 230 represent the first operation node 51 reading and determining the returned signal after outputting the high level signal. Steps 310, 320, and 330 represent the first operation node 51 reading and determining the returned signal after outputting the low level signal. Step 400 represents the second operation node 52 outputting the high level signal, and Step 500 represents the second operation node 52 outputting the low level signal; in the meanwhile, the first operation node 51 outputs the clock signal. Steps 410, 420, and 430 represent the second operation node 52 reading and determining the returned signal after outputting the high level signal. Steps 510, 520, and 530 represent the second operation node 52 reading and determining the returned signal after outputting the low level signal. It should be noted that there are two conditions for going back to Step 100: first, the returned signal is not the high level signal, the low level signal, or the clock signal, representing an indeterminable state; second, the returned signal is always the same as the output signal, representing no keys being activated.

Please refer to FIG. 5. FIG. 5 is a table corresponding to the key system 40 in FIG. 3. The operating procedure of the key system 40 is illustrated in FIG. 4, and the corresponding conditions of the two operation nodes 51, 52 and the six keys 41-46 are illustrated in the table in FIG. 5. Symbols in the table are shown as follows:

"H->H" represents outputting the high level signal, and reading the returned signal as the high level signal;

"H->L" represents outputting the high level signal, and reading the returned signal as the low level signal;

"H->CLK" represents outputting the low level signal, and reading the returned signal as the clock signal;

"L->L" represents outputting the low level signal, and reading the returned signal as the low level signal;

"L->H" represents outputting the low level signal, and reading the returned signal as the high level signal;

"L->CLK" represents outputting the low level signal, and reading the returned signal as the clock signal;

"CLK" represents outputting the clock signal.

As shown in FIG. 5, in the beginning, the first operation node 51 outputs the high level signal H, the second operation node 52 outputs the clock signal CLK, and the first operation node 51 reads a first returned signal; then, the first operation node 51 outputs the low level signal L, the second operation node 52 outputs the clock signal CLK, and the first operation node reads a second returned signal. When the first returned signal and the second returned signal are both the high level signal H, the first key 41 is activated. When the first returned signal and the second returned signal are both the low level signal L, the second key 42 is activated. When the first returned signal or the second returned signal is the clock signal CLK, the third key 43 is activated. In the following, the first operation node 51 outputs the clock signal CLK, the second operation node 52 outputs the high level signal H, and the second operation node 52 reads a third returned signal; then, the first operation node 51 outputs the clock signal CLK, the second operation node 52 outputs the low level signal L, and the second operation node 52 reads a fourth returned signal. When the third returned signal and the fourth returned signal are the high level signal H, the fourth key 44 is activated. When the third returned signal and the fourth returned signal are the low level signal L, the fifth key 45 is activated. When the third returned signal or the fourth returned signal is the clock signal CLK, the sixth key 46 activated. One end each of the first key 41 and the fourth key 44 are coupled to the high potential end 53, so when the key is activated, the operation node reads the high level signal as the returned signal. One end each of the second key 42 and the fifth key 45 are coupled to the ground GND, so when the key is activated, the operation node reads the low level signal as the returned signal. In addition, when one operation node outputs the high level signal and reads the returned signal, and then outputs the low level signal and reads the returned signal, another operation node outputs the clock signal in the meanwhile, so when the third key 43 or the sixth key 46 is started, the operation node will read the clock signal as the returned signal. If no keys are started, the operation node will read the outputted signal as the returned signal.

In summary, the present invention utilizes two operation nodes to detect a status of a plurality of keys, providing a digital and precise key system, which can reduce the usage of the I/O pins of the microcontroller.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A key system utilizing two operation nodes to detect a status of a plurality of keys comprising:
    a first key coupled between a first operation node and a high potential end;
    a second key coupled between the first operation node and a ground; and
    a third key coupled between the first operation node and a second operation node;
    wherein the key system can send and read digital signals by the first operation node and the second operation node to detect the status of the keys.

2. The key system of claim 1 further comprising:
    a transistor having a control end coupled to the first operation node via a first resistor, an output end coupled to a power supply via a second resistor, and a transistor ground end coupled to the ground;
    a fourth key coupled between the second operation node and the high potential end;
    a fifth key coupled between the second operation node and the ground; and
    a sixth key coupled between the second operation node and the output end of the transistor.

3. The key system of claim 2 further comprising a third resistor coupled between the high potential end and the power supply.

4. The key system of claim 2 wherein the transistor is a bipolar junction transistor (BJT).

5. The key system of claim 1 further comprising a third resistor coupled between the high potential end and a power supply.

6. The key system of claim 1 wherein the first operation node and the second operation node are I/O pins of a microprocessor.

7. A method for detecting statuses of a plurality of keys with two operation nodes comprising:
    (a) a first operation node outputting a high level signal, a second operation node outputting a clock signal, then the first operation node reading a first returned signal; and (b) the first operation node outputting a low level signal, the second operation node outputting the clock signal, then the first operation node reading a second returned signal;

wherein when the first returned signal and the second returned signal are high level signal, define as a first key actuating;

when the first returned signal and the second returned signal are low level signal, define as a second key actuating; and when the first returned signal or the second returned signal is the clock signal, define as a third key actuating.

8. The method of claim 7 further comprising:

(c) the first operation node outputting the clock signal, the second operation node outputting the high level signal, then the second operation node reading a third returned signal; and (d) the first operation node outputting the clock signal, the second operation node outputting the low level signal, then the second operation node reading a fourth returned signal;

wherein when the third returned signal and the fourth returned signal are high level signal, define as a fourth key actuating;

when the third returned signal and the fourth returned signal are low level signal, define as a fifth key actuating; and when the third returned signal or the fourth returned signal is the clock signal, define as a sixth key actuating.

* * * * *